United States Patent
France et al.

(10) Patent No.: US 11,499,785 B2
(45) Date of Patent: Nov. 15, 2022

(54) COMBINED THERMAL ENERGY STORAGE AND HEAT EXCHANGER UNIT

(71) Applicant: UCHICAGO ARGONNE, LLC, Chicago, IL (US)

(72) Inventors: David M. France, Lombard, IL (US); Dileep Singh, Naperville, IL (US); Wenhua Yu, Darien, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 474 days.

(21) Appl. No.: 16/413,009

(22) Filed: May 15, 2019

(65) Prior Publication Data
US 2020/0363132 A1   Nov. 19, 2020

(51) Int. Cl.
*F28D 20/00*   (2006.01)
*F28D 7/00*    (2006.01)
*H01L 23/427*  (2006.01)
*H05K 7/20*    (2006.01)

(52) U.S. Cl.
CPC ......... *F28D 7/0066* (2013.01); *F28D 7/0033* (2013.01); *H01L 23/427* (2013.01); *H05K 7/20945* (2013.01)

(58) Field of Classification Search
CPC .... F28D 7/0066; F28D 7/0033; F28D 7/0083; F28D 7/06; F28D 2020/0017; F28D 2020/0004; F28D 20/021; F28D 20/023; F28D 20/026; H01L 23/427; H05K 7/20945
See application file for complete search history.

(56) References Cited

U.S. PATENT DOCUMENTS

| | | | | |
|---|---|---|---|---|
| 3,452,720 A | * | 7/1969 | Thompson | F28D 20/021 122/32 |
| 4,063,546 A | * | 12/1977 | Schmid | C09K 5/063 126/610 |
| 4,172,491 A | * | 10/1979 | Rice | F28D 20/021 165/10 |
| 4,262,484 A | * | 4/1981 | Jubb | F02C 1/05 126/641 |
| 4,402,188 A | * | 9/1983 | Skala | A47J 27/17 62/56 |

(Continued)

*Primary Examiner* — Travis Ruby
(74) *Attorney, Agent, or Firm* — Cherskov Flaynik & Gurda, LLC

(57) ABSTRACT

The invention provides a method for storing heat and continuously generating electricity, the method comprising a phase change material; first fluid conduit in thermal communication with the phase change material wherein the first conduit is adapted to receive a first fluid; a second fluid conduit in thermal communication with the phase change material, wherein the second conduit is adapted to receive a second fluid; and a turbine in thermal communication with the second fluid. Also provided is a method for continuously charging the energy power block portion of a combined thermal energy storage and heat exchanger unit with heated fluid generated by concentrated solar power, the method comprising intermittently storing heat in a phase change material; and continually directing the heat from the phase change material to a turbine such that the phase change material buffers the turbine against inconsistent solar heat inputs.

12 Claims, 7 Drawing Sheets
(1 of 7 Drawing Sheet(s) Filed in Color)

(56) References Cited

U.S. PATENT DOCUMENTS

| | | | | |
|---|---|---|---|---|
| 5,220,954 | A * | 6/1993 | Longardner | F28F 1/14 165/10 |
| 5,269,145 | A * | 12/1993 | Krause | F01K 3/14 60/659 |
| 5,305,821 | A * | 4/1994 | Weingartner | F28D 20/023 165/10 |
| 5,687,706 | A * | 11/1997 | Goswami | F24H 7/0433 126/263.01 |
| 6,701,914 | B2 * | 3/2004 | Schwarz | F28D 20/0056 126/400 |
| 7,316,262 | B1 * | 1/2008 | Rini | F28D 20/023 165/10 |
| 7,954,321 | B2 * | 6/2011 | Shinnar | F03G 6/04 60/641.8 |
| 8,621,868 | B2 * | 1/2014 | Shinnar | F22B 1/006 60/659 |
| 9,285,170 | B2 | 3/2016 | France et al. | |
| 9,826,666 | B2 | 11/2017 | France et al. | |
| 2008/0016866 | A1 * | 1/2008 | Mohr | F28D 20/0056 60/649 |
| 2008/0099187 | A1 * | 5/2008 | Rini | F28D 20/023 165/104.17 |
| 2009/0211249 | A1 * | 8/2009 | Wohrer | F28D 20/023 60/641.8 |
| 2011/0286724 | A1 * | 11/2011 | Goodman | F28D 20/00 392/346 |
| 2013/0025817 | A1 * | 1/2013 | Callaghan | F28D 20/021 165/10 |
| 2013/0199751 | A1 * | 8/2013 | Levin | F28D 21/0003 165/10 |
| 2015/0241137 | A1 | 8/2015 | France et al. | |
| 2015/0369542 | A1 * | 12/2015 | Minvielle | F28D 20/0056 165/10 |
| 2018/0031326 | A1 * | 2/2018 | Jansen | F28F 13/003 |
| 2018/0100709 | A1 * | 4/2018 | Gopal | F01M 5/005 |
| 2018/0187059 | A1 * | 7/2018 | Iwaya | C09K 5/063 |
| 2018/0334942 | A1 * | 11/2018 | Jagle | B60H 1/20 |
| 2019/0017751 | A1 * | 1/2019 | Singh | F28D 15/00 |
| 2019/0137191 | A1 * | 5/2019 | Lawrence | F28D 1/0477 |
| 2019/0339013 | A1 * | 11/2019 | Haefele | F28D 7/10 |

* cited by examiner

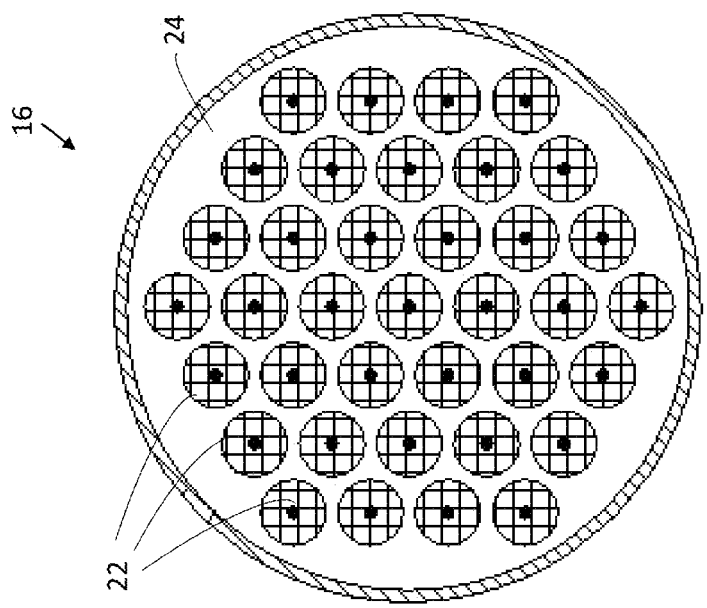
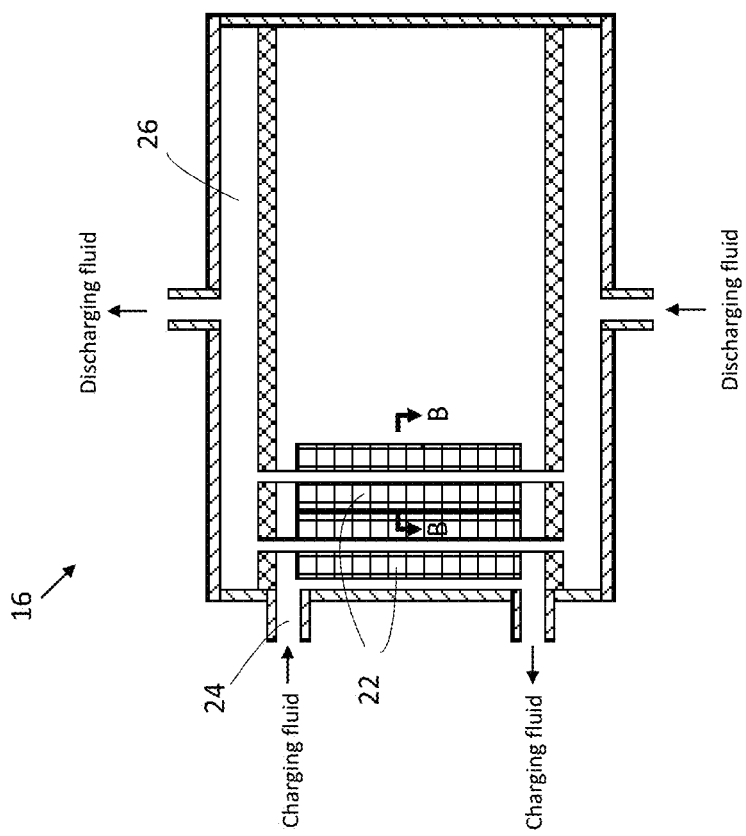
FIG. 3A
FIG. 3B

COMBINED THERMAL ENERGY STORAGE AND HEAT EXCHANGER UNIT

CONTRACTUAL ORIGIN OF THE INVENTION

The U.S. Government has rights in this invention pursuant to Contract No. DE-AC02-06CH11357 between the U.S. Department of Energy and UChicago Argonne, LLC, representing Argonne National Laboratory.

BACKGROUND OF THE INVENTION

1. Field of the Invention

This invention relates to energy storage and more specifically, this invention relates to a device and method for simultaneously storing and transporting heat.

2. Background of the Invention

Thermal energy storage systems are most often designed to receive heat at one time and use it at a later time. Typically a first fluid carries heat to a storage vessel in a charging step.

Fluid removes heat from the storage vessel in a discharging step. It is during this discharging step that the heat is utilized. For example, a second fluid that removes heat from the storage vessel may be used directly in an industrial process, or to boil water to turn a steam turbine that turns an electric generator. Alternatively, the second fluid may transfer its heat via a heat exchanger to a third fluid. The third fluid then could be used as a source of heat in industrial processes.

As depicted in FIG. 1, designated as "Prior Art," these systems involve two heat exchangers 2, 4. FIG. 1 depicts the current technology for concentrated solar power (CSP) electric plants. The electric power block area 6 is where a turbine and electric generator are located. A first heat exchanger 2 is situated there for the electric power block 6 to receive heat. Also provided is an energy power block comprising a second heat exchanger 4 for thermal energy storage.

In the first heat exchanger 2, a first fluid, heated by the solar power tower, supplies heat to the electric power block to generate electricity. At the same time, the first fluid stores heat in the energy power block through the second heat exchanger 4. At a later time when the stored heat is needed to generate electricity, the first fluid receives heat through the second heat exchanger 4 and transfers it to a second fluid in the electric power block 6 through the first heat exchanger 2.

This dual heat exchanger arrangement is a costly approach to thermal energy storage. There are many valves and extensive piping involved, and there are two large heat exchangers that work both independently and together at different times of the CSP plant cycle.

A need exists in the art for an efficient method and device for transporting and storing heat from a thermodynamic perspective. The method and device should significantly lower cost by combining the function of two heat exchangers into a single heat exchanger. The method and device should be modular to facilitate manufacturing, installation, repair and maintenance.

SUMMARY OF INVENTION

An object of the invention is to provide a low cost method and system for heat storage and transfer that overcomes many of the drawbacks of the prior art.

Another object of the invention is to provide a method and system for storing and utilizing heat. A feature of the invention is that it combines phase change modules with a single heat exchanger to replace the energy power block heat exchanger and the electric power block heat exchangers. This combination defines a combined thermal energy storage and heat exchanger unit. An advantage of the invention is that while heat is constantly provided to the electrical power block, heat to the phase change modules can vary in either calories, temperature, or both. This variation is due to changes in weather such as solar radiation intensity, ambient temperature, time of day, etc. In a CSP electric plant during the day, heat is simultaneously supplied to both the electric power block for immediate use and to the phase-change material (PCM) modules for storage, via the combined thermal energy storage and heat exchanger unit. At night, heat is transferred only from the PCM to the electrical power block via the same combined thermal energy storage and heat exchanger.

Yet another object of the invention is to provide a method and system for storing and transporting heat entrained in fluids. A feature of the invention is that a plurality of different fluid phases are accommodated. An advantage of the invention is that two heat exchangers and phase change material modules can be encapsulated within a single combined thermal energy storage and heat exchanger unit, therefor realizing lower cost compared to state of the art, separate component systems.

Another object of the present invention is to utilize a thermal energy storage module to both harvest and store energy from a concentrated solar power (CSP) source and continuously supply energy to an electric power block. A feature of the invention is that the module provides a buffering system as part of a Latent Heat Transfer Energy System (LHTES). An advantage of the invention is that a single module, or each of several modules, is/are capable of continuously feeding an electric power block (e.g., turbine) with usable heated fluid while intermittently receiving heat from the CSP system. This advantage effects the combination of two heat exchangers, resulting in cost savings.

Briefly, the invention provides a system for storing heat and simultaneously transferring heat from a first fluid to a second fluid, the method comprising a phase change material; a first fluid conduit in thermal communication with the phase change material, and adapted to receive the first fluid, wherein the first conduit is adapted to intermittently receive heat; a second fluid conduit in thermal communication with the phase change material, and adapted to receive the second fluid, wherein the second conduit is adapted to receive heat; and a load continuously thermally charged by the second fluid.

Also provided is a method for continuously charging a latent heat thermal energy storage (LHTES) phase change material (PCM) with heated fluid, the method comprising intermittently storing and discharging heat in the PCM, while continually directing the heat to an electric power block.

The invention further provides a method for continuously charging an energy power block with heated fluid generated by concentrated solar power, the method comprising intermittently storing heat in a phase change material; and continually directing the heat from the phase change material to a turbine such that the phase change material buffers the turbine against inconsistent solar heat inputs.

BRIEF DESCRIPTION OF DRAWINGS

The patent or application file contains at least one drawing executed in color. Copies of this patent or patent application publication with color drawing(s) will be provided by the Office upon request and payment of the necessary fee.

The invention together with the above and other objects and advantages will be best understood from the following detailed description of the preferred embodiment of the invention shown in the accompanying drawings, wherein:

FIG. 3A is a schematic view of a shell and tube configuration of the combined thermal energy storage and heat exchanger unit, in accordance with features of the present invention;

FIG. 3B is a cross sectional view of a shell and tube configuration of a combined thermal energy storage and heat exchanger unit, in accordance with features of the present invention;

DETAILED DESCRIPTION OF THE INVENTION

Figure 1:
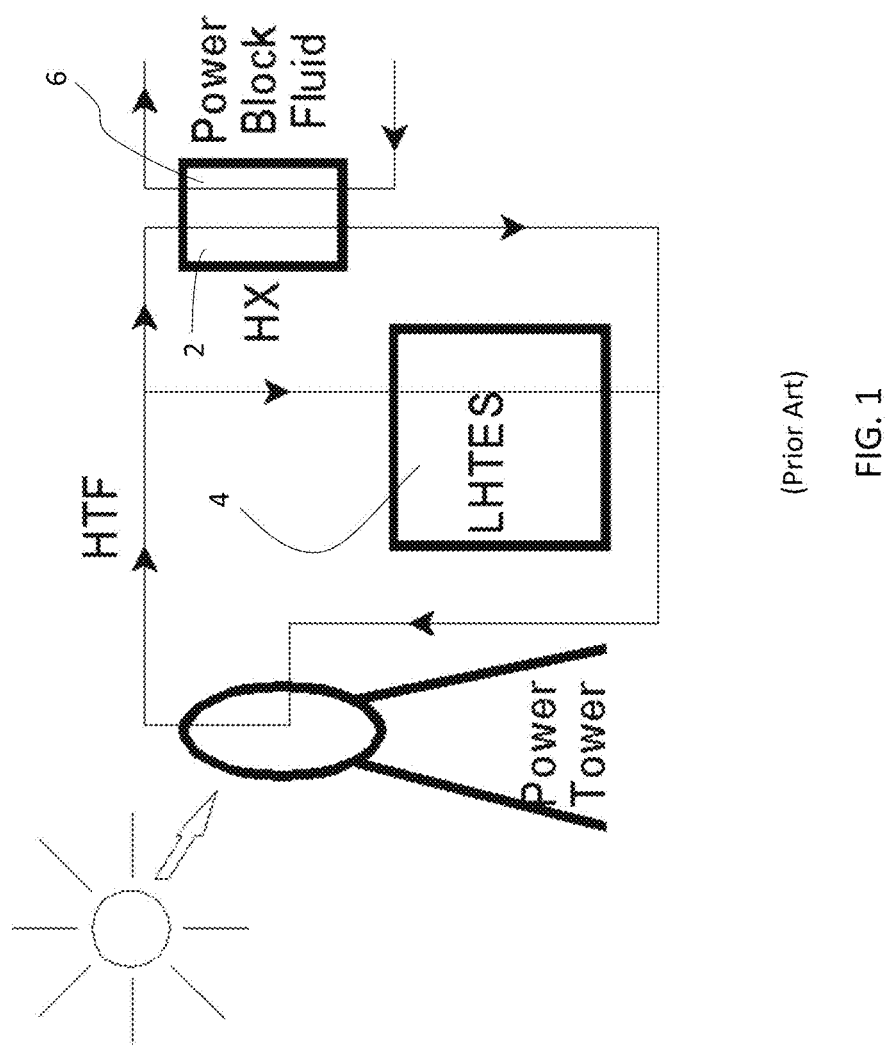
FIG. 1 is a schematic of a prior art latent heat thermal energy system.

The foregoing summary, as well as the following detailed description of certain embodiments of the present invention, will be better understood when read in conjunction with the appended drawings.

All numeric values are herein assumed to be modified by the term "about", whether or not explicitly indicated. The term "about" generally refers to a range of numbers that one of skill in the art would consider equivalent to the recited value (e.g., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

The following detailed description should be read with reference to the drawings in which similar elements in different drawings are numbered the same. The drawings, which are not necessarily to scale, depict illustrative embodiments and are not intended to limit the scope of the invention.

As used herein, an element or step recited in the singular and preceded with the word "a" or "an" should be understood as not excluding plural said elements or steps, unless such exclusion is explicitly stated. As used in this specification and the appended claims, the term "or" is generally employed in its sense including "and/or" unless the content clearly dictates otherwise.

Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The invention provides a method and a device that simultaneously stores heat for later use and transfers heat for instant use. The heat transferred to the thermal load always comes from a PCM/foam mixture. This structure adds thermal buffering to the method and system. The invention differs from prior art where heat is stored in one device and transferred to the thermal load in another device. The instant invention provides substantial cost saving in that it combines the functions of two heat exchange devices into a single heat exchange/storage unit (interchangeably referred to herein as a combined thermal energy storage and heat exchanger unit).

A myriad of phase change materials are suitable for use with the invented method and system, including, but not limited to magnesium chloride; chlorides of sodium, potassium and calcium, and combinations thereof. Also, exemplary foams for mixing with the PCM include, but are not limited to, graphite, aluminum, copper, steel, high thermal conductivity foam material, and combinations thereof.

A salient feature of the invention is that during charging, a hot fluid supplies heat to a thermal storage medium at all times, and a second fluid receives heat from the thermal storage medium at all times. During this charging process, enough heat is supplied to the single heat exchanger such that some is stored and some is transmitted through the storage medium to the second fluid. During discharging, heat is transferred from the thermal storage medium to the second fluid.

The invented system and method embodies a single heat exchanger to which hot fluid delivers heat during charging. The heat is conducted through thermal storage- and thermal conductive-media to a second fluid for use. Thus, heat is stored and utilized simultaneously in a single heat exchanger. During discharging, the first fluid may not deliver heat, but heat is still continuously transferred from the storage medium to the second fluid for use.

Most phase change materials (PCMs) are poor conductors of heat; this makes them impractical for most applications. However, the current invention utilizes a hybrid thermal energy storage medium. A portion of the medium is a material that changes phase from solid to liquid and uses the latent heat of fusion for thermal energy storage. Another portion of the medium is thermally conductive foam or other substrate. Using a PCM/foam combination in this manner reduces size and cost of the thermal storage system, and significantly increases the heat transfer rates to and from the PCM and thus the entire combined thermal energy storage and heat exchanger unit. The PCM/foam substrate increases heat transfer rates while the latent heat of fusion reduces size and the modular configuration reduces cost of manufacturing, fabrication, repair and maintenance. This combination of features substantially increases the heat transfer rates to and from the PCM and results in a simultaneous heat-storage and heat-usage system.

The invention is capable of service at temperatures from below 0° C. to above 700° C. In instances where the invention is utilized to harvest energy from concentrated solar power (CSP) electric plant applications, its typical range of operating temperatures are from 300° C. to 800° C., where appropriate PCM's are available.

Specifically, the invention is capable of storing and transmitting large amounts of energy for large central electric power plants, wherein fluid temperatures may exceed 800° C. The invention's application to a 100 MW solar electric power plant would store approximately 3 GJ of energy during the day for use overnight. This requires the shuttling of fluids initially interacting with the system to be at a temperature between 500° C. and 800° C.

Figure 2:
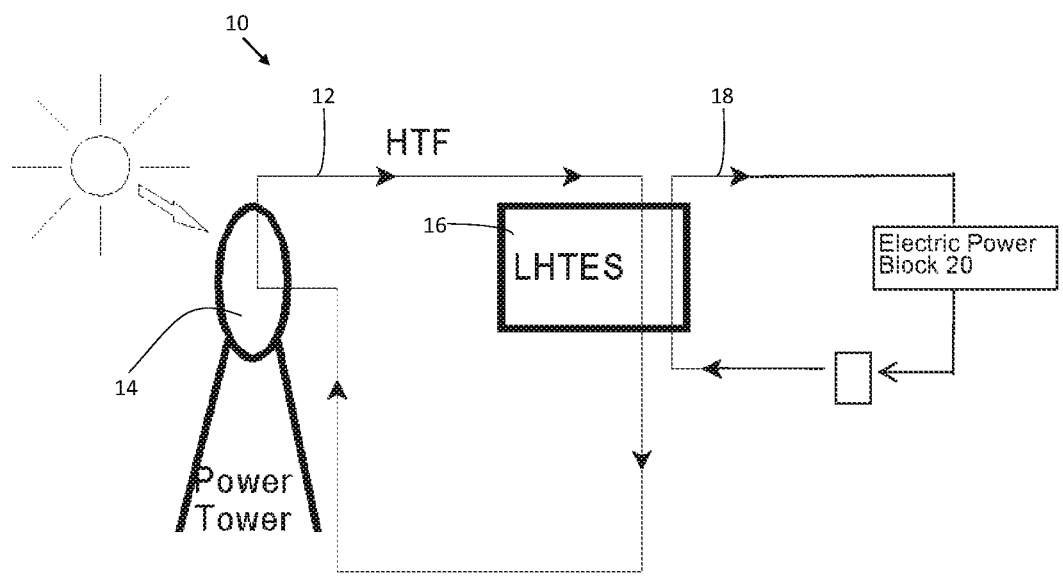
FIG. 2 is a schematic of a combined thermal energy storage and heat exchanger unit, including a latent heat thermal energy storage and buffer system, in accordance with features of the present invention.

The invention is designated as numeral 10 in FIG. 2. The combined thermal energy storage and heat exchanger unit is designated as numeral 16. The figure is specific for a method and system for harvesting and dispensing heat from a concentrated solar plant CSP. Because heat is continuously being transferred through the PCM to the secondary fluid during charging (to service the electric power block), temporary mismatches between heat supply and heat demand are accommodated (buffered) by heat addition or subtraction from the PCM.

In an embodiment of the invention, heat transfer fluid coursing through a CSP collector is in thermal communication with phase change material during daytime charging. Some heat remains in the PCM during daytime charging, and some is transferred through the PCM to the second fluid in the electric power block for generating electricity.

Heat transfer to the PCM from the CSP collector (e.g., solar arrays, heliostats, Fresnel lenses, etc.) can vary while heat input to the electric power block is constant, even at night and/or when less heat is generated by the collector. (This is the buffering aspect of the invention for CSP electric plants.) At night, the first heat transfer fluid does not supply heat to the PCM but the second heat transfer fluid in thermal communication with the electric power block continues to receive stored heat from the PCM.

In the CSP electric plant of FIG. 2, a first heat transfer fluid loop 12 (e.g., a first conduit) is positioned so as to be utilized between the collector 14 and the energy storage PCM 16. A second heat transfer fluid loop 18 (e.g., a second conduit) is positioned between the PCM 16 and the electric power block 20. The first and second heat transfer fluids may be the same phase, the same material, or different phases and different materials from each other. Typical HTF's for the first fluid loop 12 are molten salts, gases such as carbon dioxide or helium, or liquid metals such as sodium. The salt can be heated to its melting temperature and the resulting liquid flowed into the system. System restart, after shutdown at low temperatures, may require the first conduit to be preheated above the melting point of the salt so that it can be liquefied and pumped.

Suitable electric power block fluids may be liquids, gases, or combinations thereof. For example, the fluid loop 18 servicing a CSP is typically comprised of water/steam or carbon dioxide.

Salient components of the invented system include a phase-change material (PCM/foam combination) to store energy, a first charging heat transfer conduit subsystem between the collector and the PCM and a second heat transfer and discharging conduit between the electric power block and the PCM. Inasmuch as the first and second conduits are separate, the invention eliminates any fluid and/or chemical communication between the collector and the electric power block. It should be noted that any mention of an electric power block includes a combined thermal energy storage and heat exchanger unit.

The LHTES comprises one or a plurality of modules, each module containing a mixture of phase change material and thermally conductive substrate (e.g. the foam discussed herein). This module improves heat transfer, energy storage and thermal buffering efficiency via the following attributes:

Small size due to using the latent heat of fusion of a phase change material;

Fast energy transfer during the day time charging process and during the nighttime discharging process due to the foam substrate. (Some heat remains in the PCM during daytime charging);

Heat to PCM can vary while heat to power block is constant, for the buffering effect.

Heat from PCM is transferred to the electric power block at night when there is no fluid communication to the power tower 14 (solar collectors). No buffering occurs at night. (In CSP applications, no heat is supplied at night from the sun, only heat stored in the PCM is transferred (i.e., discharged) to the electric power block.)

The combined thermal energy storage and heat exchanger unit 16 comprises a plurality of storage modules. The modules may have a variety of configurations. The shell and tube configuration of FIGS. 3A-3B are schematic diagrams of the combined thermal energy storage and heat exchanger unit 16 showing the modules 22 contained therein.

FIG. 3B shows several storage media modules 22 contained within the combined thermal energy storage and heat exchanger unit 16, which is depicted in end view. Each of the modules are in thermal and fluid communication with two separate fluid streams. A first fluid stream 24 is supplied by the first fluid loop 12 (FIG. 2). A second fluid stream 26 is supplied by the second fluid loop 18. The origins of the fluids also may be reversed, such that the fluid stream 24 is supplied by the second loop 18 of FIG. 2. Flow rates of the two fluids may vary. For example, the flow rate of the first fluid from a 50 MWe CSP electric plant may be from 400 kg/s to 600 kg/s. Flow rate of the second fluid (e.g., $CO_2$) may be from 450 kg/s to 650 kg/s.

FIG. 3A shows the first fluid 24 (i.e., the charging fluid) from the solar collector 14 (shown in FIG. 2) enveloping the external surfaces of each module 22 so as to physically contact the external surfaces. This envelopment results in thermal conductance between the charging fluid and the phase change material encapsulated within the module. FIG. 3A shows adjacent modules 22 in physical contact with each other. Despite the modules physically contacting each other, charging fluid still contacts virtually all of the exterior surfaces of the modules. FIG. 3B shows adjacent modules spaced from each other such that larger volumes of the first fluid circulate between the modules.

FIG. 3A shows the second fluid 26 (i.e. the discharging fluid) in thermal communication with the interior of each module 22. However, the second fluid 26 is not in fluid communication with the interior in that the fluid does not physically contact the phase change media and foam mixture encapsulated by the module. As such, a thermally conductive conduit separates the second fluid 26 from the interior of the module 22, with the conduit extending the entire length of the module. A myriad of materials may comprise the conduit, so long as the conduit is suitably thermally conductive. Such suitable materials may include Inconel, aluminum, copper, steel, ceramic, and alloys thereof. Inconel, steel and ceramic are particularly suitable for high temperature applications such as CSP plants.

The relative flow direction of the first fluid 24 and second fluid 26 in the embodiments shown in FIGS. 2 and 3 are not specified. As such, the charging fluid 24 and discharging fluid 26 may enter and/or leave the combined thermal energy storage and heat exchanger unit on the same side (co-current flow) or on opposite sides (counter-current flow).

However, the invented system and method may also provide for cross current flows of the two fluids. For example, FIG. 4 shows a combined thermal energy storage and heat exchanger unit defining a cross flow arrangement, whereas FIG. 5 shows a counter flow arrangement of this double tube configuration.

Figure 4:
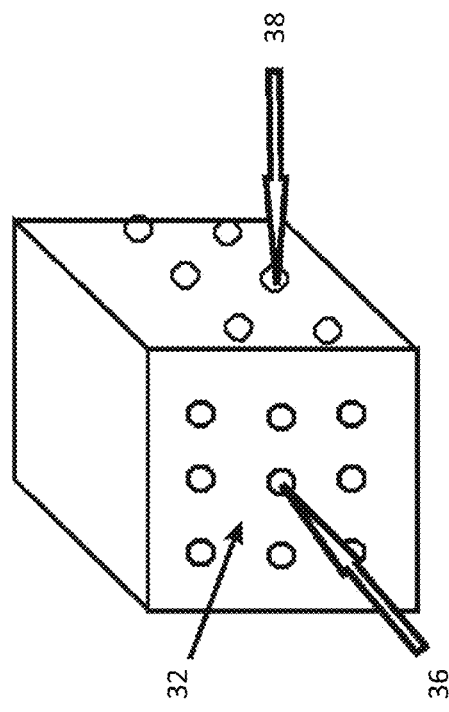
FIG. 4 is a schematic view of a double tube, cross flow configuration of the combined thermal energy storage and heat exchanger unit, in accordance with features of the present invention.

Specifically, FIG. 4 depicts a block of the phase change composite 32 defining first fluid conduit chases 36 and second fluid conduit chases 38. The two sets of chases are shown extending into the block generally at right angles to each other so as to define a cross flow of fluids. Aside from right angles, other angles can be utilized, generally from 30 to 70 degrees. The flow rates of the two fluids may be similar or dissimilar, depending on the constituencies of each fluid. However, if molten salt is utilized for the first fluid, a flow rate of between 400 kg/s and 600 kg/s is suitable for a 50 MWe CSP electric plant. Also, if carbon dioxide gas is the fluid in the second conduit, a flow rate of between 450 kg/w and 650 kg m/s is suitable for this plant. These flow rates are applicable to all of the configurations discussed, i.e. shell and tube, double tube, tube and annulus, with counter flow, co-current flow or cross flow depicted in FIGS. 3 through 6, and discussed infra.

Figure 5:
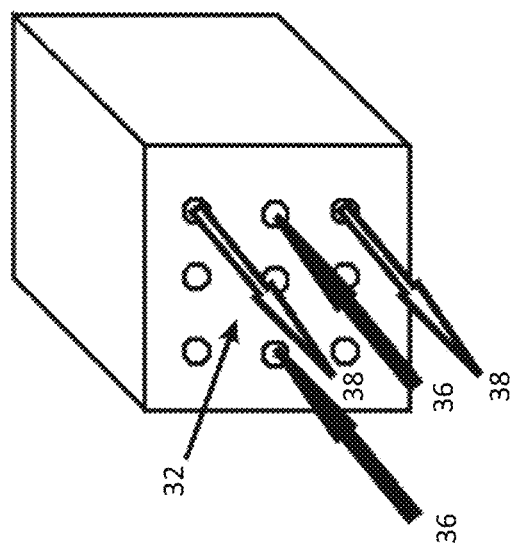
FIG. 5 is a schematic view of a double tube, counter flow configuration of the combined thermal energy storage and heat exchanger unit, in accordance with features of the present invention.

FIG. 5 shows the two sets of chases arranged so that an ingress end of first fluid chase 36 is proximal to an egress end of the second fluid chase 38. As such the ingress and egress ends of the first and second chases are situated on the same side of the phase change composite block. However, the configuration in FIG. 5 also allows for the ingress ends of both fluid conduits to be on the same side of the block, such that the egress ends of both fluid conduits will be located on the opposite end of the block. This arrangement allows for the counter flow shown, and co-current flow is also possible.

Figures 6A, 6B:
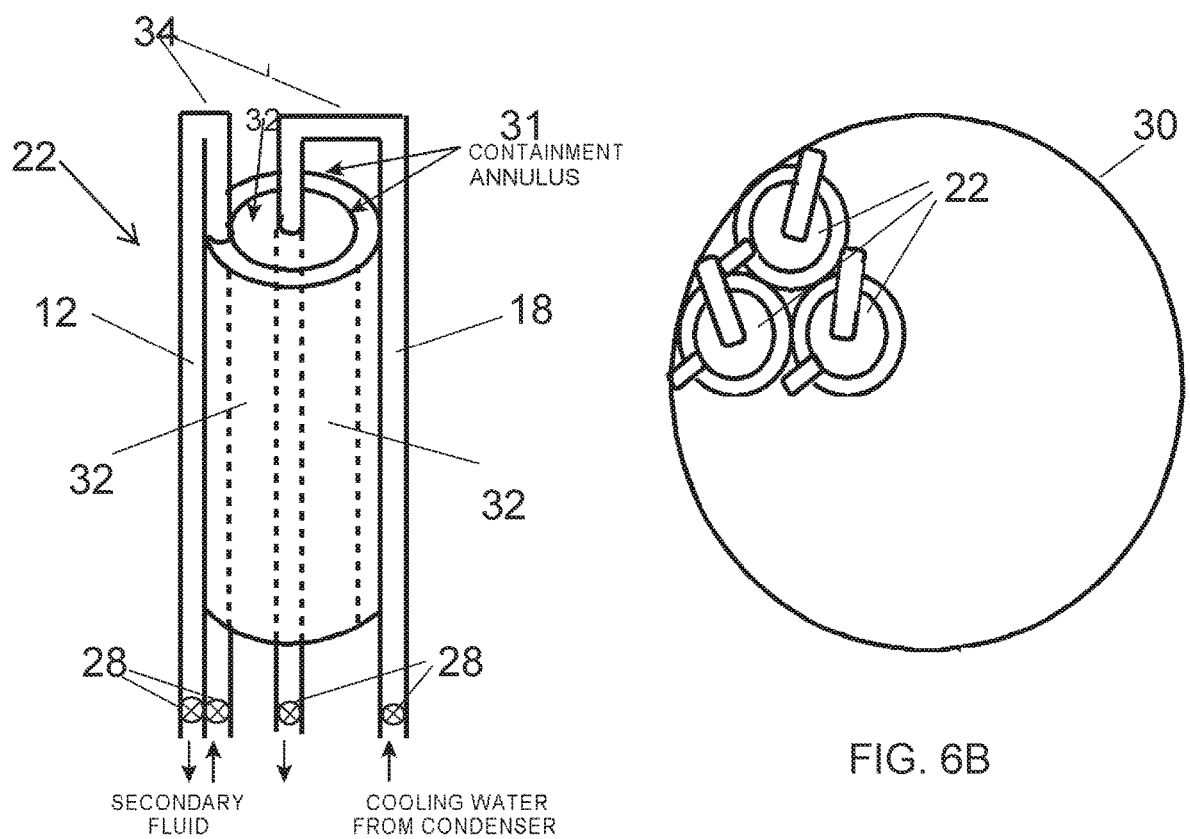
FIG. 6A is a schematic view of a single energy storage module with a tube and annulus configuration of the combined thermal energy storage and heat exchanger unit, in accordance with features of the present invention.
FIG. 6B is a top view of a plurality of energy storage modules, with a tube and annulus configuration of the combined thermal energy storage and heat exchanger unit, in a housing, in accordance with features of the present invention.

FIG. 6A shows another configuration of the plumbing in and around the module 22—a tube and annulus configuration. As in the afore-described configuration, the first fluid loop 12 in this configuration transports fluid from the solar energy collector 14 to the energy storage block module 22, and back again. The second fluid loop 18 transports fluid from an annular space 31 enveloping the module 22 to the electric power block, and back again. The opposite arrangement is possible with the first loop transporting fluid to the power block. Both loops are closed and continuous such that no intermixing between fluids occurs.

The second fluid stream is completely confined by the second fluid loop 18 such that none of that fluid physically contacts external surfaces of the modules 22. Rather, the fluids supplied by both the first and second fluid loops 12, 18, are confined within the loops. Longitudinally extending regions of both loops may be in physical contact with longitudinally extending external surfaces of the module. This feature aids in thermal conductance to and from the fluid and to and from the module. Also, this feature allows all fluid connections to be made on the same end of the modules for ease of installation and removal for maintenance.

FIG. 6A also shows regions of both loops extending within the interior regions of the module 22. (FIG. 6B is a top view of a housing containing three modules. It should be appreciated that in industrial scale production scenarios, the housing would be filled with modules 22.) The internally positioned portion of the second fluid loop 18 may be coaxially positioned with the longitudinal axis of the module 22. These internally positioned regions of the loops (relative to the module) provide the surface area for the thermal exchange with the PCM/foam mixture.

Loop regions 34 intermediate to their externally extending and internally extending portions define a bend, such that the bend, the externally extending regions and the internally extending regions of each conduit are contiguous with each other so as to allow fluid flow throughout the conduit. The bend may ultimately effect a 180 degree diversion in fluid flow. While shown as a simple "U" shape in the figures, the bend may also effect a spiral or other configuration to provide additional thermal conductance to substrates contacting the bend. Finally, a valve or diversion loop may be contiguous with the bend.

The means of fluid ingress and egress for each loop 12, 18 is shown positioned at the same end of the module. This allows for easy replacement of faulty modules without the need for shutting down the entire system. (These modules are positioned in housings 30 which, when dealing with 100 megaWatt systems may span 100 feet in diameter and be 30 feet high. Valves 28 may be used to isolate the faulty module from the remaining circulation system during replacement/repair. FIG. 6A shows the valves positioned at the same end of the module with a valve provided for each ingress end of the first and second conduits and each egress end of the first and second conduits.

Further, instead of valves, the ends of the conduits may integrate with the rest of the system via a series of snap fit assemblies, again positioned all at the same end of the module to afford easy and rapid swap out of faulty modules 22.

In summary of this point, longitudinally extending regions of the each of the loops intermediate of its first and second ends are in thermal communication with a phase change composite 32. The phase change composite 32 comprises a phase change material 34 homogeneously mixed with a high surface area, high thermal conductivity foam 36. Generally, a suitable porosity of the foam is from about 60 to 90 percent, and preferably from about 80 to 90 percent.

FIG. 6B shows the housing 30 in which to sequester a plurality of modules 22. The housing 30 is a thermally insulating material to minimize heat loss. The housing 30 need not have a high structural feature because each module is self-contained. Although each module may be thermally insulated, it is cost effective to use a single thermally insulating housing 30 surrounding the perimeter of all modules taken together.

The phase change material composite 32 thereby embodies a high latent heat of fusion in small effective volumes given the flexible geometry conferred via the use of the modules 22. (Suitable latent heat of fusion values range from about 100 to about 400 kJ/kg, depending on the PCM utilized. For example, the latent heat of fusion for water is about 334 kJ/kg.) This combines the advantages of large energy storage capacity from the latent heat of fusion of the PCM and the high thermal conductivity of the foam structure with the versatility of the modular configuration to provide an efficient, cost effective, small volume, and versatile combined thermal energy storage and heat exchanger unit.

Figure 7:
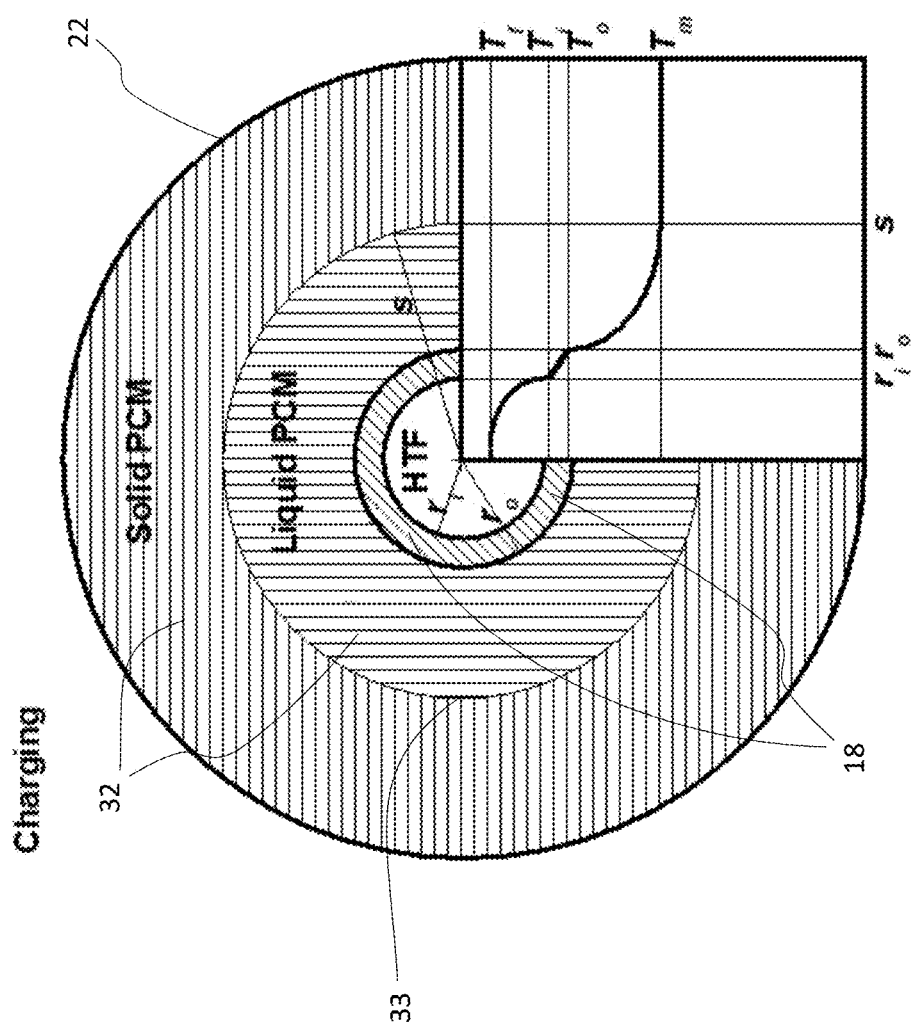
FIG. 7 is a schematic of thermal gradients within a module of configurations of FIGS. 3 and 6 of the combined thermal energy storage and heat exchanger unit, in accordance with features of the present invention.

FIG. 7 shows a cross sectional view of a module 22 during the heating (i.e., charging) process of a combined thermal energy storage and heat exchanger unit. In this situation, the solid PCM is at its melt temperature Tm (which varies by the PCM utilized), and it is being melted by hot heat transfer fluid (the first HTF 24) contacting the inside surface of the module from the CSP.

FIG. 7 features a superimposed temperature distribution graph detailing thermal transfer from the heat transfer fluid, through the pipe, the liquid PCM/foam combination, and the solid PCM/foam combination.

Heat transfer fluid (HTF) 26 flows outside the module 22 and in the second fluid loop 18 and is heated by the PCM-foam composite 32. The PCM is at its melt temperature, Tm, and the liquid-solid interface 33 moves outward during the process as some heat melts more PCM. Some heat is transferred through the PCM to the second HTF destined for the electric power block. Tf is the HTF temperature in the module conduit 18, and Ti and To are the conduit temperatures at the inside and outside surfaces of the conduit, respectively.

Figure 8:
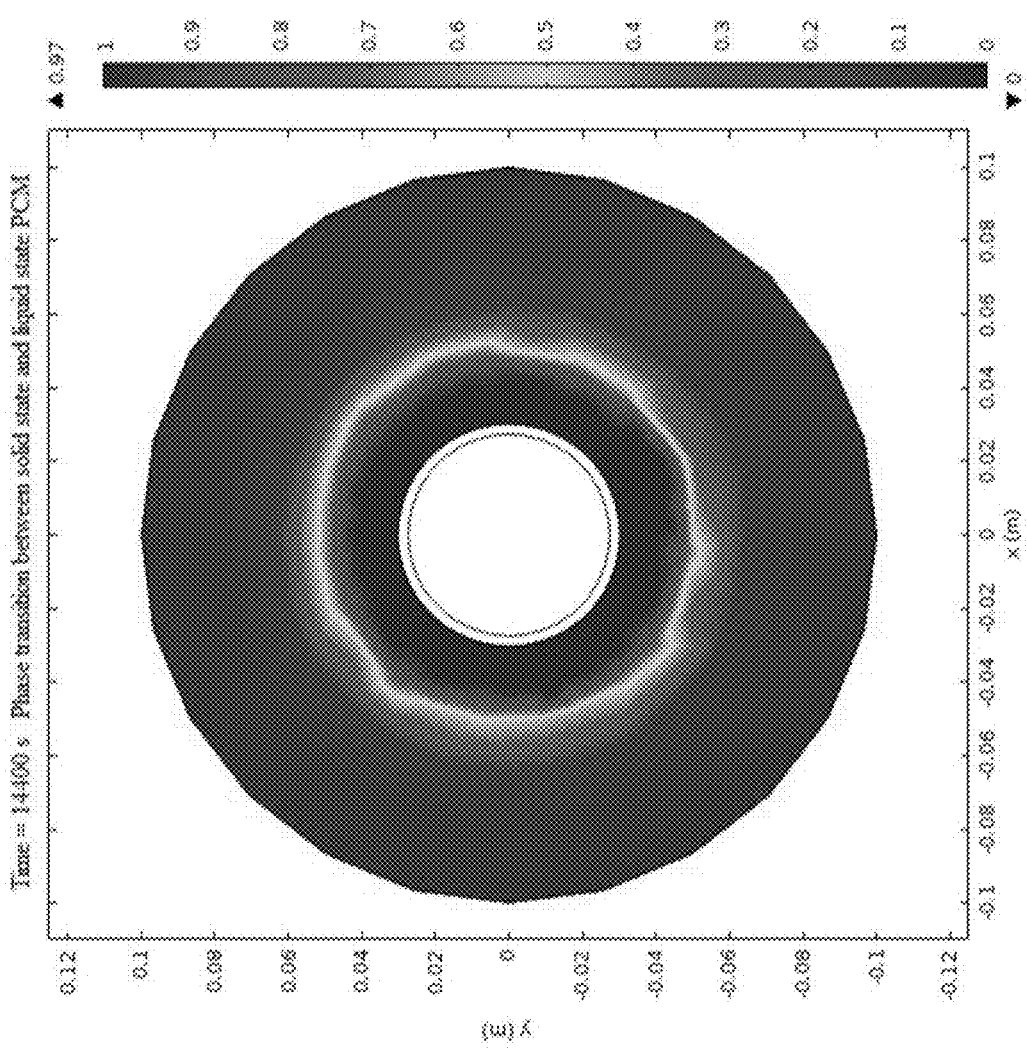
FIG. 8 is a thermograph of heat gradients within the PCM of a module of configurations of FIGS. 3 and 6 of the combined thermal energy storage and heat exchanger unit, in accordance with features of the present invention.

FIG. 8 is a computational fluid dynamic (CFD) simulation of a discharge process where a cold fluid flowing in a tube is receiving heat from the surrounding PCM/foam. The PCM is initially all hot liquid, and as the fluid receives heat the PCM solidifies. FIG. 8 shows the PCM partway through the solidification (discharge) process. The PCM contacting the tube and therefore proximal to the tube is solidified, while regions of the PCM further radially displaced from the tube it is liquid. A solid/liquid boundary is visible as the white region between the blue solidified PCM and the red liquid PCM. The temperature scale in FIG. 8 goes from the coldest solid (darkest blue) to the hottest liquid (darkest red). In some PCM/foam mixtures, the thermal conductivity has different values in different directions shown as x and y in FIG. 8. In such cases, the solid/liquid boundary is more oval than circular in the x-y plane.

A myriad of phase change materials are suitable for incorporation in the invented system. Generally, the PCM should have a melting temperature to accommodate turbine gas temperatures of 700° C. or higher. PCM melting temperatures between about 700° C. and about 800° C. are suitable, and preferably between 710 and 750° C. Flow pressures of approximately 3000 psi when $CO_2$ as the second fluid stream 26 contacts the turbine within the electric power block are not uncommon. Exemplary phase change materials include, but are not limited to magnesium chloride, chlorides of sodium, potassium and calcium and eutectics of them, and combinations thereof.

In summary, this invention deals with thermal energy storage inside a heat exchanger transferring heat between two fluids. Thermal buffering is inherent in the invention. It is an LHTES system that employs PCM/foam modules in thermal contact with two separate fluids. One fluid supplies heat, some of which is stored in the PCM, and the remainder of which is transferred to the second fluid (via thermal conductance) for immediate use. At a time when no heat is supplied from the first fluid, heat may still be transferred to the second fluid from the PCM/foam. This is the heat storage feature of the invention providing heat for use a time later than when it was transferred to the combined thermal energy storage and heat exchanger unit.

All of this is accomplished in a small volume due to the use of PCM material, at fast heat transfer rates due to the use of porous high conductivity foams, in a flexible configuration due to the modular aspect of the invention, at with high temperature capabilities in excess of 800 C. In addition, the heat in an out of the PCM need not be the same at all times. When heat input is reduced for a period of time, heat is removed from the PCM to allow the second fluid to continue to be heated without change. This action is akin to a thermostat and provides the buffering capacity of the invented system. This thermal buffering allows the final process (e.g. thermal charging of a turbine within an electric power block) to proceed on a continuous basis even though the heat source may be intermittent.

It is to be understood that the above description is intended to be illustrative, and not restrictive. The above-described embodiments (and/or aspects thereof) may be used in combination with each other. For example, three module configurations are described, but they are not comprehensive. First and second fluids shown in the diagrams in the two fluid loops could be reversed. The PCM materials utilized in the invention can be any with the appropriate melt temperature for the application. Modules may be of any size.

Many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The embodiment of the invention in which an exclusive property or privilege is claimed is defined as follows:

1. A system for storing heat and simultaneously transferring heat from a first fluid to a second fluid, the system comprising:
   a) a phase change material;
   b) a module comprising a first fluid conduit in thermal communication with the phase change material and adapted to receive the first fluid wherein the first conduit is adapted to intermittently transfer heat to and from the phase change material;
   c) a second fluid conduit enveloping the phase change material and adapted to receive the second fluid to enable heat to be continuously transferred from the phase change material to the second fluid wherein the first fluid conduit and the second conduit are separate to prevent fluid communication between the first and second conduit; and
   d) a load continuously receiving heat from the second fluid.

2. The system as recited in claim 1 wherein the first conduit and the second conduit are in thermal communication with each other.

3. The system as recited in claim 1 wherein the phase change material is positioned between the first conduit and the second conduit so as to be in thermal communication with each conduit.

4. The system as recited in claim 1 wherein the first fluid and the second fluid are comprised of the same material.

5. The system as recited in claim 1 wherein the phase change material thermally buffers heat transfer to the second fluid.

6. The system as recited in claim 1 wherein the phase change material is homogeneously mixed with foam having a porosity of between about 80 percent and 90 percent to create a composite.

7. The system as recited in claim 6 wherein the composite comprises about 80 percent to about 90 percent by volume of phase change material.

8. The system as recited in claim 1 wherein the material exhibits a latent heat of fusion of about 100 to 400 kJ/kg.

9. The system as recited in claim 1 wherein the first fluid conduit is adapted to receive heat exchange liquid from a concentrated solar energy source and the second fluid conduit is adapted to receive heat exchange gas.

10. The system as recited in claim 9 wherein the heat exchange gas is in thermal communication with an electric power block for generating electricity.

11. The system as recited in claim 10 wherein the power block includes a turbine and electric generator.

12. The system as recited in claim 1 wherein the second conduit defines an annular space surrounding the phase change material.

* * * * *